United States Patent
Liang et al.

(10) Patent No.: US 6,600,364 B1
(45) Date of Patent: *Jul. 29, 2003

(54) ACTIVE INTERPOSER TECHNOLOGY FOR HIGH PERFORMANCE CMOS PACKAGING APPLICATION

(75) Inventors: Chunlin Liang, San Jose, CA (US); Xiao-Chun Mu, Saratoga, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 6 days.

(21) Appl. No.: 09/225,418

(22) Filed: Jan. 5, 1999

(51) Int. Cl.$^7$ ............................................. H01L 25/00
(52) U.S. Cl. ...................... 327/564; 361/767; 361/807
(58) Field of Search ................................. 327/564–566; 439/620; 361/767–771, 785, 807, 811

(56) References Cited

U.S. PATENT DOCUMENTS

| | | | | |
|---|---|---|---|---|
| 4,782,381 A | * | 11/1988 | Ruby et al. | 257/724 |
| 5,016,087 A | * | 5/1991 | Haug et al. | 257/750 |
| 5,177,594 A | * | 1/1993 | Chance et al. | 257/678 |
| 5,384,692 A | * | 1/1995 | Jaff | 361/807 |
| 5,583,378 A | | 12/1996 | Marrs et al. | |
| 5,642,262 A | | 6/1997 | Terrill et al. | |
| 5,668,399 A | * | 9/1997 | Cronin et al. | 257/532 |
| 5,674,785 A | | 10/1997 | Akram et al. | |
| 5,981,314 A | | 11/1999 | Glenn et al. | |
| 6,137,164 A | | 10/2000 | Yew et al. | |
| 6,188,127 B1 | | 2/2001 | Senba et al. | |
| 6,274,929 B1 | | 8/2001 | Leong et al. | |

OTHER PUBLICATIONS

Sergent, J.E. and Harper, C.A.; Hybrid Microelectronics Handbook, Second Edition, McGraw–Hill, Inc. 1995, pp. 1–12–1–15.

* cited by examiner

Primary Examiner—Kenneth B. Wells
(74) Attorney, Agent, or Firm—Blakely, Sokoloff, Taylor & Zafman LLP

(57) ABSTRACT

An integrated circuit assembly that includes an integrated circuit which is connected to an interposer. The integrated circuit may include a logic circuit which generates an output signal. The interposer may include a driver circuit that regenerates the output signal. The interposer may also contain a clock signal that is connected to the logic circuit. Separating the driver circuit from the integrated circuit may provide an assembly which reduces the amount of noise in the logic circuit created by the driver circuit switching states. Additionally, providing the clock circuit on the interposer allows the clock to be fabricated with a more robust process than the logic circuit of the integrated circuit.

17 Claims, 1 Drawing Sheet

ACTIVE INTERPOSER TECHNOLOGY FOR HIGH PERFORMANCE CMOS PACKAGING APPLICATION

BACKGROUND OF THE INVENTION

1. Field of the Invention

The present invention relates to an integrated circuit assembly.

2. Background Information

Computer systems typically contain one or more microprocessors that perform various tasks in accordance with instructions and data. The instructions and data can be transmitted, stored and retrieved from other devices such as a dynamic random access memory (DRAM) integrated circuit or a hard disk drive.

The microprocessor is typically fabricated as a single integrated circuit that is assembled into a package. The package may be soldered to a printed circuit board commonly referred to as a motherboard. Likewise, memory devices may be formed in separate integrated circuits that are packaged and mounted to the motherboard. Separating the microprocessor and the memory circuits simplifies the design, replacement and repair of the two components.

The microprocessor typically contains core logic memory circuits that receive input signals and provide output signals. The microprocessor may also have driver and buffer circuits that provide an interface between the logic/memory circuits and other devices coupled to the processor. It has been found that the driver circuits may create electrical noise in the power and ground busses of the integrated circuit when switching states. The noise may affect the operation of the logic/memory circuits of the microprocessor.

There have been developed integrated circuits with on-board filtering capacitors which reduce the noise created by the driver circuits. On-board capacitors increase the complexity and the cost of mass producing the microprocessor. It would therefore be desirable to provide an integrated circuit assembly that would isolate the driver circuits from the core logic/memory circuits of a microprocessor.

A microprocessor will typically contain a clock circuit(s) that is connected to the logic/memory circuits. The clock circuit is typically constructed with the same fabrication process as the other logic/memory circuits of the processor. It is desirable to reduce the line widths, etc. of an integrated circuit to increase the transistor density of the circuit. Unfortunately, improving transistor density may also reduce the robustness of the clock circuit, introducing additional skew and other undesirable signal conditions. It would be desirable to separate the clock circuit from the logic/memory circuit of the processor.

The input/output (I/O) signals, and power/ground are provided to the microprocessor or through die pads located on an external surface of the integrated circuit. The die pads are typically connected to a substrate or interposer of the integrated circuit package. The substrate/interposer is mounted to a printed circuit board such as the motherboard of a computer.

There have been developed integrated circuit packages which connect the integrated circuit to the substrate/interposer with a plurality of solder bumps with a process commonly referred to as controlled collapsed chip connection (C4). The solder bumps are located within a two-dimensional array that extends across a bottom surface of the integrated circuit. The substrate/interposer includes routing traces and vias that connect the solder bumps to contacts that are attached to the printed circuit board. The substrate/interposer "fans-out" the relatively small die pad pitch of the integrated circuit to the larger contact pad pitch of the printed circuit board. It would be desirable to utilize the substrate/interposer for functions other than fanning out the signals of the integrated circuit.

SUMMARY OF THE INVENTION

One embodiment of the present invention is an integrated circuit assembly that includes an integrated circuit which is connected to an interposer. The integrated circuit may include a logic circuit which generates an output signal. The interposer may include a driver circuit that regenerates the output signal.

DETAILED DESCRIPTION

Figure 1:
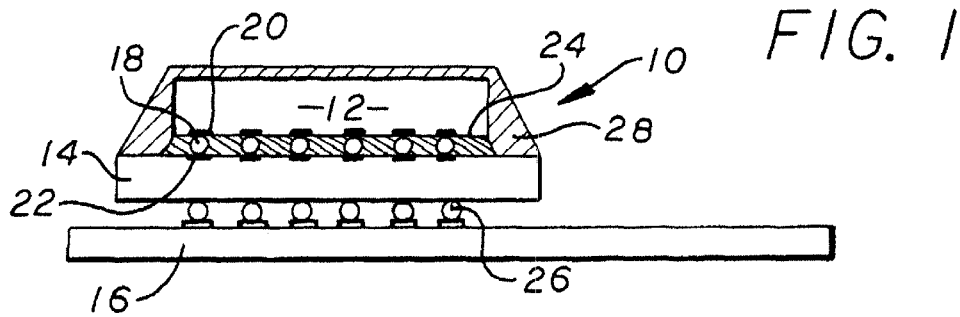
FIG. 1 is a side sectional view of an embodiment of an integrated circuit assembly of the present invention.

Referring to the drawings more particularly by reference numbers, FIG. 1 shows an embodiment of an integrated circuit assembly 10 of the present invention. The assembly 10 may include an integrated circuit 12 that is connected to an interposer 14. The interposer 14 may be connected to a printed circuit board 16. The printed circuit board 16 may be the motherboard of a computer which contains other devices. Alternatively, the printed circuit board 16 may be the substrate of an electronic cartridge such as a single edge contact cartridge (SECC) sold by Intel Corporation, the assignee of the present invention.

The assembly 10 may include a plurality of solder bumps 18 that are attached to die pads 20 of the integrated circuit 12 and corresponding contact pads 22 of the interposer 14. The solder bumps 18 may be formed and attached with a process commonly referred to as controlled collapsed chip connection (C4). Some of the pads 20 and 22 are dedicated to input/output (I/O) signals, while other pads 20 and 22 are dedicated to power or ground. To improve the structural integrity of the solder bumps 18 an underfill epoxy material 24 may be dispensed into the integrated circuit/interposer 14 interface.

The interposer 14 may be attached to the printed circuit board 16 with a plurality of solder balls 26. Alternatively, the interposer 14 may be attached to the circuit board 16 with a plurality of solder bumps 18. The integrated circuit 12 may be enclosed by an encapsulant 28.

Figure 2:
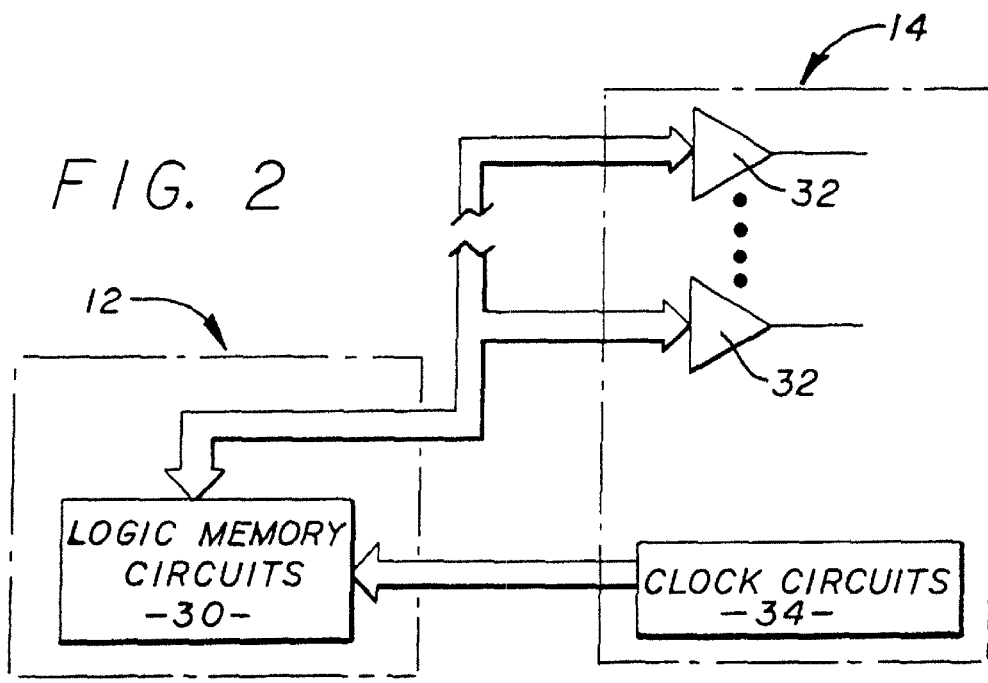
FIG. 2 is a schematic of the integrated circuit assembly.

As shown in FIG. 2, the integrated circuit 12 may be a microprocessor that contains logic and memory circuits 30. The interposer 14 may contain driver circuits 32 that are connected to the output pads of the microprocessor. The driver circuits 32 can regenerate output signals that are generated by the logic/memory circuit 30 of the microprocessor. Moving the driver circuits 32 onto the interposer 14 may reduce the amount of electrical noise on the power rail of the microprocessor created by the circuits 32 switching states. Although driver circuits 32 are shown and described, it is to be understood that the interposer 14 may also have buffer circuits (not shown) that are connected to the die pads of the integrated circuit 12.

The interposer 14 may also have a clock circuit(s) 34 which provides a clock signal to the logic/memory circuit 30. The interposer 14 can be constructed with known integrated circuit fabrication processes to construct the transistors, etc. required to create the driver circuits 32 and the clock circuit 34. Moving the clock circuit 34 to the interposer 14 allows the clock 34 to be created with a fabrication process that is more robust than the process used to form the integrated circuit 12.

Figure 3:
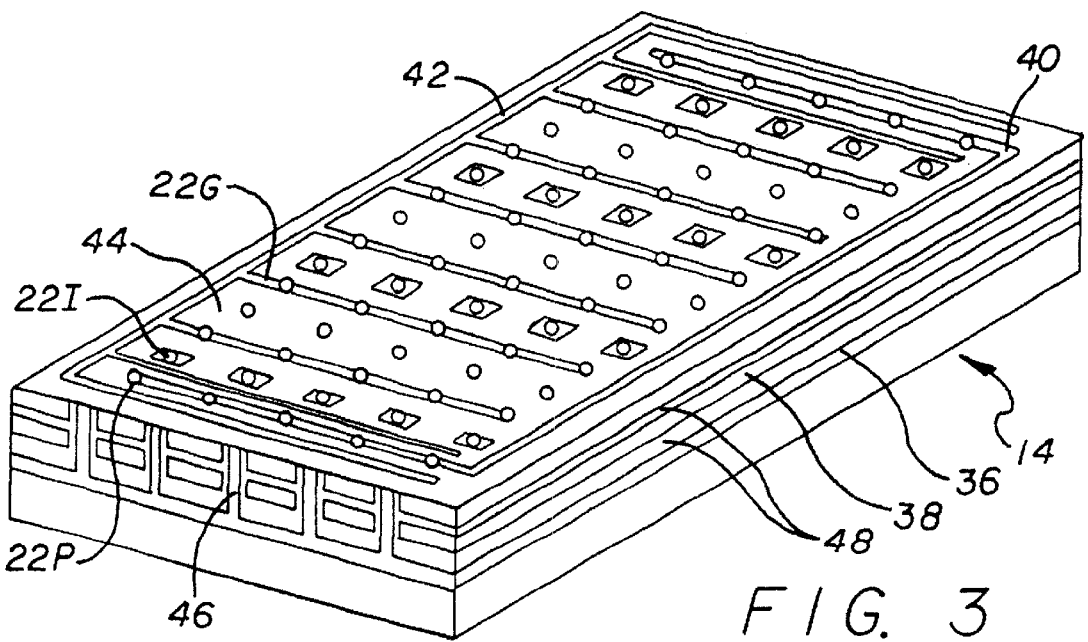
FIG. 3 is a perspective view of an interposer of the assembly.

FIG. 3 shows an embodiment of an interposer 14. The interposer 14 may have an internal power plane 36 and an internal ground plane 38. The power 36 and ground 38 planes may be connected to corresponding power and ground planes (not shown) of the printed circuit board by the solder balls shown in FIG. 1.

The interposer 14 may have a number of interconnected power busses 40 and a plurality of interconnected ground busses 42 located on an external surface 44. The power and ground pins of the driver circuits 32 can be connected to the internal power 36 and ground 38 planes, respectively. The power 40 and ground 42 busses may be connected to the power 36 and ground 38 planes by vias 46.

The power 40 and ground 42 busses may be connected to contact pads 22P and 22G that are dedicated to power and ground, respectively. The interposer 14 may also have I/O contact pads 22I that are connected to corresponding I/O die pads of the integrated circuit. The I/O contact pads 22I may be coupled to the circuit board by vias 46 in the interposer 14. The power 40 and ground 42 busses may be formed in an alternating pattern so that the ground busses 42 provide an electrical "shield" to noise created on the power busses 40.

The internal ground plane 38 may be separated from the internal power plane 36 and the power busses 40 by dielectric material 48 which together form filtering capacitors. The capacitors filter noise in the power rail of the interposer 14. Forming the filtering capacitors within the interposer 14 eliminates the need to form the capacitors within the integrated circuit 12 and thus reduces the complexity and increases the yield of mass producing the circuit 12. Additionally, the internal ground plane 38 may be located between the internal power plane 36 and the integrated circuit 12 to provide a shield for noise generated within the power plane of the interposer 14.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit assembly, comprising:

an integrated circuit including a logic circuit and a memory circuit; and, an interposer that is connected to said integrated circuit mounted thereon, said interposer including (1) a power plane, a ground plane, and a dielectric material placed between said power plane and said ground plane to form a filtering capacitor, (2) a clock circuit to generate a clock signal that is transmitted to said memory circuit, and (3) a driver circuit to regenerate an output signal generated by the logic circuit.

2. The assembly of claim 1, wherein:

said internal ground plane being located between said internal power plane and said integrated circuit to shield said integrated circuit from noise generated within said internal power plane.

3. The assembly of claim 1, wherein said ground plane of the interposer is coupled between the power plane and the integrated circuit.

4. The assembly of claim 1, wherein said power plane of the interposer is coupled to the logic circuit and a power supply.

5. The assembly of claim 1, further comprising an underfill epoxy material dispensed between a bottom surface of said integrated circuit and a top surface of said interposer.

6. The assembly of claim 1, wherein said power bus on said external surface of said interposer including at least two interconnected power buses.

7. The assembly of claim 1, wherein said ground bus on said external surface of said interposer including at least two interconnected ground buses.

8. The assembly of claim 1, wherein said plurality of I/O contact pads being positioned between neighboring interconnected ground buses.

9. An electronic assembly comprising:

a circuit board;

an integrated circuit including a core logic and a memory circuit; and, an interposer coupled to both said circuit board and said integrated circuit mounted thereon, said interposer including (1) a power plane, a ground plane, and a dielectric material placed between said power plane and said ground plane to form at least one filtering capacitor, (2) a clock circuit to generate a clock signal that is transmitted to said memory circuit of said integrated circuit, and (3) a driver circuit to regenerate an output signal previously generated by said core logic of the integrated circuit.

10. The electronic assembly of claim 9, further comprising an underfill epoxy material dispensed between a bottom surface of said integrated circuit and a top surface of said interposer.

11. The electronic assembly of claim 9, wherein said integrated circuit is a microprocessor.

12. The electronic assembly of claim 11, wherein said microprocessor including output pads of which at least one output pad being coupled to the driver circuit.

13. The electronic assembly of claim 11 further comprising an encapsulant enclosing said integrated circuit.

14. The electronic assembly of claim 9, wherein an external surface of said interposer is adapted to include a power bus, a ground bus and a plurality of input/output (I/O) contact pads for coupling to I/O die pads of said integrated circuit.

15. The electronic assembly of claim 14, wherein said power bus on said external surface of said interposer including at least two interconnected power buses.

16. The electronic assembly of claim 14, wherein said ground bus on said external surface of said interposer including at least two interconnected ground buses.

17. The electronic assembly of claim 16, wherein said plurality of I/O contact pads being positioned between neighboring interconnected ground buses.

* * * * *